US008420484B2

United States Patent
Yoo

(10) Patent No.: US 8,420,484 B2
(45) Date of Patent: Apr. 16, 2013

(54) SEMICONDUCTOR DEVICE HAVING A BURIED GATE THAT CAN REALIZE A REDUCTION IN GATE-INDUCED DRAIN LEAKAGE (GIDL) AND METHOD FOR MANUFACTURING THE SAME

(75) Inventor: Min Soo Yoo, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 42 days.

(21) Appl. No.: 13/184,887

(22) Filed: Jul. 18, 2011

(65) Prior Publication Data
US 2011/0275188 A1  Nov. 10, 2011

Related U.S. Application Data

(62) Division of application No. 12/493,268, filed on Jun. 29, 2009, now Pat. No. 8,004,048.

(30) Foreign Application Priority Data

Jun. 4, 2009 (KR) .................. 10-2009-0049351

(51) Int. Cl.
*H01L 21/336* (2006.01)
(52) U.S. Cl.
USPC .... 438/270; 438/259; 438/700; 257/E21.006; 257/E21.147; 257/E21.247; 257/E21.545; 257/E21.548
(58) Field of Classification Search .................. 438/270, 438/700, 194, 267, 257, 259, 272; 257/E21.006, 257/E21.147, E21.247, E21.545, E21.548
See application file for complete search history.

(56) References Cited

U.S. PATENT DOCUMENTS

| 6,476,444 | B1 | 11/2002 | Min |
| 6,964,926 | B2 * | 11/2005 | Huang et al. .................. 438/700 |
| 7,139,161 | B2 * | 11/2006 | Komuro et al. ............ 361/321.1 |
| 7,923,331 | B2 * | 4/2011 | Han et al. ...................... 438/270 |
| 8,004,048 | B2 * | 8/2011 | Yoo ............................... 257/396 |
| 2008/0157194 | A1 | 7/2008 | Lee et al. |
| 2008/0203455 | A1 | 8/2008 | Jang et al. |
| 2008/0296670 | A1 | 12/2008 | Lee et al. |

FOREIGN PATENT DOCUMENTS

| KR | 1020050011376 A | 1/2005 |
| KR | 100843711 B1 | 6/2008 |
| KR | 1020080089095 A | 10/2008 |
| KR | 1020080104779 A | 12/2008 |

OTHER PUBLICATIONS

USPTO OA mailed Aug. 20, 2010 in connection with U.S. Appl. No. 12/493,268.
USPTO OA mailed Oct. 19, 2010 in connection with U.S. Appl. No. 12/493,268.
USPTO NOA mailed Apr. 18, 2011 in connection with U.S. Appl. No. 12/493,268.

* cited by examiner

*Primary Examiner* — David Nhu
(74) *Attorney, Agent, or Firm* — Ladas & Parry LLP

(57) ABSTRACT

A semiconductor device having a buried gate that can realize a reduction in gate-induced drain leakage is presented. The semiconductor device includes a semiconductor substrate, a buried gate, and a barrier layer. The semiconductor substrate has a groove. The buried gate is formed in a lower portion of the groove and has a lower portion wider than an upper portion. The barrier layer is formed on sidewalls of the upper portion of the buried gate.

13 Claims, 14 Drawing Sheets

SEMICONDUCTOR DEVICE HAVING A BURIED GATE THAT CAN REALIZE A REDUCTION IN GATE-INDUCED DRAIN LEAKAGE (GIDL) AND METHOD FOR MANUFACTURING THE SAME

CROSS-REFERENCE TO RELATED APPLICATIONS

The present application claims priority to Korean patent application number 10-2009-0049351 filed on Jun. 4, 2009, and to the divisional application of Ser. No. 12/493,268 filed on Jun. 29, 2009 which is now U.S. Pat. No. 8,004,048 which are all incorporated herein by reference in their entirety.

BACKGROUND OF THE INVENTION

The present invention relates to a semiconductor device and a method for manufacturing the same, and more particularly, to a semiconductor device which can realize a reduction in gate-induced drain leakage (GIDL) and a method for manufacturing the same.

As the design rule for achieving more highly integrated semiconductor devices continues to demand decreases the critical dimensions, a problem can arise with regards to unwanted short channel effects across these resultant diminished channel lengths of the highly integrated transistors. Doping concentrations of a source region and a drain region may also need to be increased to enhance the electric fields which can also cause unwanted increases in junction leakage current. Due to these constraints, it is becoming more and more difficult to achieve an appropriate threshold voltage needed in these highly integrated transistor semiconductor devices that are configured to have a planar channel structure. Therefore, limitations necessarily exist in improving refresh characteristics of these highly integrated planar transistor semiconductor devices.

In order to address these problems, a recess gate in which a channel length is effectively increased which results in realizing a suppression of the short channel effect has been proposed and studied in the art. However, since the recess gate is formed so that a gate electrode projects outwardly from a semiconductor substrate, it then becomes more difficult to conduct subsequent processes such as conducting contact plug forming processes and planarization processes without compromising the integrity of the outwardly projecting recess gate.

Under these circumstances, a buried gate in which a gate electrode is formed within the interior of semiconductor substrate has been proposed. In the buried gate configuration, the gate electrode is formed in the semiconductor substrate, and as a result subsequent processes such as contact plug forming processes and planarization processes can be more easily performed without compromising the structural integrity of the buried gate. Furthermore, since the buried gate electrode does not contact a bit line, then advantages can be realized such as decreasing the parasitic capacitance.

When forming the buried gate, a metallic material is mainly used as a gate electrode material. In this regard, since the metallic material has a work function relatively higher than a polysilicon layer, then the gate-induced drain leakage (GIDL) current is prone to increasing. The GIDL current further increases where the gate electrode adjoins a source region and a drain region. Due to this fact, in the conventional art, as leakage current increases, a data retention time decreases, whereby the characteristics and the reliability of a semiconductor device are likely to be compromised.

BRIEF SUMMARY OF THE INVENTION

Embodiments of the present invention are directed to a semiconductor device that can realize a reduction in GIDL and a method for manufacturing the same.

Also, embodiments of the present invention are directed to a semiconductor device that can realize a reduction in leakage current, thereby improving the characteristics and the reliability of the resultant semiconductor device, and a method for manufacturing the same.

In one embodiment of the present invention, a semiconductor device comprises a semiconductor substrate having a groove; a buried gate formed in a lower portion of the groove and having a width that is narrower on an upper portion of the buried gate than a lower portion of the buried gate; and a barrier layer formed on sidewalls of the upper portion of the buried gate.

The barrier layer is formed on the sidewalls of the upper portion of the buried gate and sidewalls of an upper portion of the groove.

The barrier layer comprises an oxide layer or a nitride layer.

The semiconductor device further comprises a capping layer formed on the buried gate to fill the groove; and source and drain regions formed in portions of the semiconductor substrate on both sides of the buried gate.

In another embodiment of the present invention, a method for manufacturing a semiconductor device comprises the steps of defining a groove by etching a semiconductor substrate; forming a barrier layer on sidewalls of an upper portion of the groove; and forming a buried gate in a lower portion of the groove such that an upper portion of the buried gate contacts the barrier layer and the buried gate has a width that is narrower on the upper portion of the buried gate than a lower portion of the buried gate.

The barrier layer comprises a nitride layer.

The step of forming the barrier layer comprises the steps of forming a sacrificial layer to fill a lower portion of the groove; forming a material layer for a barrier on the sacrificial layer and a surface of the groove; etching the material layer for a barrier such that the material layer for a barrier remains only on sidewalls of an upper portion of the groove; and removing the sacrificial layer.

After the step of forming the buried gate, the method further comprises the steps of forming a capping layer on the buried gate to fill the groove; and forming source and drain regions in portions of the semiconductor substrate on both opposing sides of the buried gate.

After the step of forming the buried gate, the method further comprises the steps of removing the barrier layer; forming a capping layer on the buried gate to fill the groove removed with the barrier layer; and forming source and drain regions in portions of the semiconductor substrate on both sides of the buried gate.

The capping layer comprises an oxide layer.

In still another embodiment of the present invention, a semiconductor device comprises a semiconductor substrate having a first groove and a second groove which communicates with a lower end of the first groove and has a width narrower than the first groove; a buried gate formed in the second groove and a lower portion of the first groove and having the same with on upper and lower portions thereof; and a barrier layer formed on sidewalls of an upper portion of the buried gate.

The barrier layer is formed on the sidewalls of the upper portion of the buried gate and sidewalls of the first groove.

The barrier layer comprises an oxide layer or a nitride layer.

The semiconductor device further comprises a capping layer formed on the buried gate to fill the first groove; and source and drain regions formed in portions of the semiconductor substrate on both sides of the buried gate.

In a still further embodiment of the present invention, a method for manufacturing a semiconductor device comprises the steps of defining a first groove by primarily etching a semiconductor substrate; forming a barrier layer on sidewalls of the first groove; defining a second groove by etching a portion of the semiconductor substrate on a bottom of the first groove to have a width narrower than the first groove; and forming a buried gate in the second groove and a lower portion of the first groove such that the buried gate contacts the barrier layer on an upper portion thereof and upper and lower portions of the buried gate have the same width.

The barrier layer comprises a nitride layer.

After the step of forming the buried gate, the method further comprises the steps of forming a capping layer on the buried gate to fill the first groove; and forming source and drain regions in portions of the semiconductor substrate on both sides of the buried gate.

After the step of forming the buried gate, the method further comprises the steps of removing the barrier layer; forming a capping layer on the buried gate to fill the first groove removed with the barrier layer; and forming source and drain regions in portions of the semiconductor substrate on both opposing sides of the buried gate.

The capping layer comprises an oxide layer.

DESCRIPTION OF SPECIFIC EMBODIMENTS

Hereafter, specific embodiments of the present invention will be described in detail with reference to the accompanying drawings. It is understood herein that the drawings are not necessarily to scale and in some instances proportions may have been exaggerated in order to more clearly depict certain features of the invention.

Figure 1:
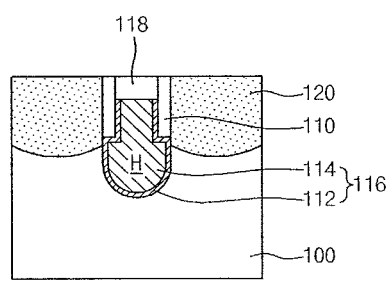
FIG. 1 is a sectional view illustrating a semiconductor device in accordance with a first embodiment of the present invention.

FIG. 1 is a sectional view illustrating a semiconductor device in accordance with a first embodiment of the present invention. A groove H is defined in a semiconductor substrate 100, and a buried gate 116 is formed in the lower portion of the groove H such that the lower portion of the buried gate 116 is wider than the upper portion of the buried gate 116. The buried gate 116 preferably comprises a metal-based layer, for example, the buried gate 116 may include a titanium nitride layer 112 formed on the surfaces of the lower portion of the groove H. A barrier layer 110 and a tungsten layer 114 may be formed on the titanium nitride layer 112 to fill in the lower portion of the groove H. The barrier layer 110 is formed along the sidewalls of the upper portion of the buried gate 116 and along the sidewalls of the upper portion of the groove H. The barrier layer 110 preferably comprises, for example, a nitride layer at a thickness of preferably about 50~500 Å. A capping layer 118 comprising an oxide layer is formed on the buried gate 116 so that it completely fills in the groove H. Source and drain regions 120 are formed in portions of the semiconductor substrate 100 along both opposing sides of the buried gate 116.

In the first embodiment of the present invention, due to the fact that the buried gate 116 fills in the lower portion of the groove H defined in the semiconductor substrate 100 so that a gate electrode does not project out of the semiconductor substrate 100, it is possible to protect against the occurrence of a bridging phenomenon while conducting a contact plug forming process and a planarization process. As a consequence of utilizing the present invention, since the occurrence of unwanted bridging contacts between the buried gate 116 and a bit line is protected against then parasitic capacitances can be reduced.

Also, in the present invention, because leakage current between the buried gate 116 and the source and drain regions 120 can be reduced by the barrier layer 110 which is formed on the sidewalls of the upper portion of the buried gate 116, then GIDL (gate-induced drain leakage) can also be reduced. Accordingly, data retention times can be increased, as well as, enhancing characteristics and the reliability of a resultant semiconductor device made from the present invention can be improved.

In addition, in the first embodiment of the present invention, since the barrier layer 110 is formed only on the sidewalls of the upper portion of the groove H, then the upper portion of the buried gate 116, which has a width smaller than the lower portion of the buried gate 116, is formed to project upward. By doing this in the present invention, the sheet resistance of the buried gate 116 can be reduced, whereby further improvement in the characteristics and the reliability of the semiconductor device made from the present invention can be realized.

FIGS. 2A through 2H are sectional views illustrating the processes of a method for manufacturing a semiconductor device in accordance with a second embodiment of the present invention.

Figure 2A:
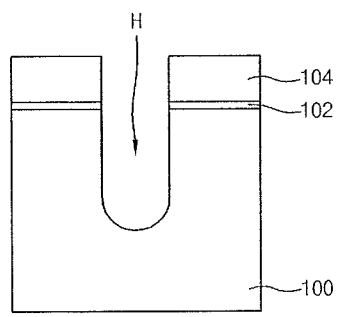
FIGS. 2A through 2H are sectional views illustrating the processes of a method for manufacturing a semiconductor device in accordance with a second embodiment of the present invention.

Referring now to FIG. 2A, after sequentially forming a pad oxide layer 102 and a pad nitride layer 104 on a semiconductor substrate 100, by subsequently patterning the pad nitride layer 104 and the pad oxide layer 102, a gate forming region of the semiconductor substrate 100 is exposed. Then, by etching the exposed region of the semiconductor substrate 100, a groove H for a gate is defined within the semiconductor substrate 100.

Figure 2B:
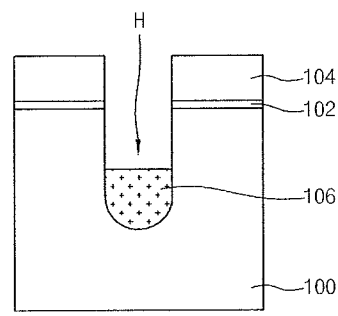

Referring to FIG. 2B, after forming a sacrificial layer 106 to fill the groove H, the surface of the sacrificial layer 106 is subsequently planarized. The sacrificial layer 106 is preferably formed as a layer which is more easily etched than the barrier. That is, the sacrificial layer 106 has an etching selectivity with respect to a material layer for the barrier. Accordingly, the sacrificial layer 106 may comprise, for example, an oxide layer or a photoresist film. After planarizing the sacrificial layer 106, the sacrificial layer 106 is then etched back so that the sacrificial layer 106 remains only in the lower portion of the groove H. It is preferred that the sacrificial layer 106 be etched so that the remaining portion of the sacrificial layer 106 remains below the lower ends of where the source and drain regions will be subsequently formed. Accordingly, it is preferred that the remaining portion of the sacrificial layer 106 after the etching is at a depth of about 100~1,000 Å.

Figure 2C:
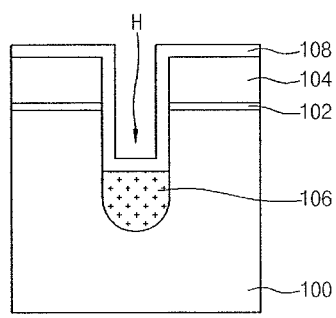

Referring now to FIG. 2C, a material layer 108 for a barrier is formed on the sacrificial layer 106, on the sidewalls of the groove H and on the pad nitride layer 104. The particular compositional makeup of the material layer 108 for a barrier is preferably composed of a substance that etches more easily than the sacrificial layer 106. That is the material layer 108 for the barrier is formed as a layer which has an etching selectivity with respect to the sacrificial layer 106, for example, as a nitride layer, preferably, to a thickness of about 50~500 Å.

Figure 2D:
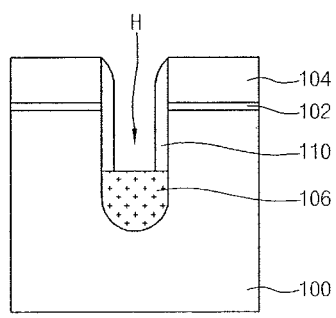

Referring to FIG. 2D, the material layer 108 for a barrier is etched so that the material layer 108 for a barrier remains substantially only on the sidewalls of the upper portion of the groove H. The etching of the material layer 108 for a barrier is performed by using an etch-back process. As a result of the etching, a barrier layer 110 is formed on the sidewalls of the upper portion of the groove H.

Figure 2E:
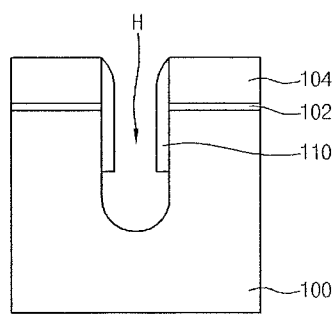

Referring now to FIG. 2E, the sacrificial layer 106 is subsequently removed by preferably using a dip-out process. The dip-out process is conducted in such a way as to selectively remove the sacrificial layer 106, and therefore, the barrier layer 110 that is formed on the sidewalls of the upper portion of the groove H is not substantially removed.

Figure 2F:
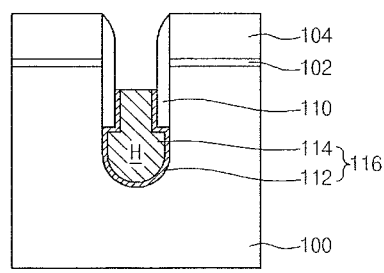

Referring now to FIG. 2F, after all of the sacrificial layer 106 has been removed, a gate insulation layer (not shown) is formed on the surface of the lower portion of the groove H and on the surface of the barrier layer 110. Afterwards a titanium nitride layer 112 is formed on the gate insulation layer. Thereupon, a tungsten layer 114 is formed on the titanium nitride layer 112 to fill in the groove H. Then, the tungsten layer 114, the titanium nitride layer 112 and the gate insulation layer are all etched back so that the tungsten layer 114, the titanium nitride layer 112 and the gate insulation layer remain only in the lower portion of the groove H.

As a result, a buried gate 116 is formed so that the buried gate 116 is filled in the lower portion of the groove H and contacts the barrier layer 110 at the upper portion thereof. The buried gate 116 is formed in so that the upper portion of the buried gate 116 has a smaller width, by the thickness of the barrier layer 110 formed on the sidewalls of the upper portion of the groove H, than the lower portion of the buried gate 116. As a consequence, the upper portion of the buried gate 116 has a projecting shape.

Figure 2G:
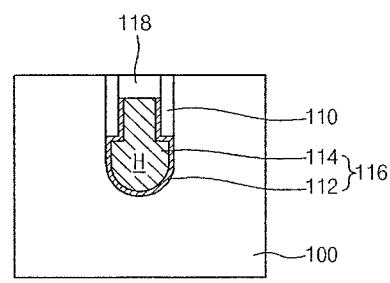

Referring now to FIG. 2G, a capping layer 118 is formed on the buried gate 116 to completely fill in the groove H. The capping layer 118 is formed, for example, as an oxide layer. Next, the capping layer 118, the barrier layer 110, the pad nitride layer 104 and the pad oxide layer 102 are removed in a manner so as to expose the upper surface of the semiconductor substrate 100.

Figure 2H:
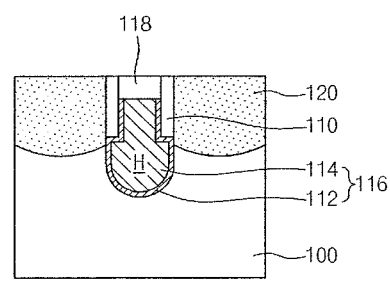

Referring to FIG. 2H, by conducting an ion-implantation process for the exposed semiconductor substrate 100, source and drain regions 120 are formed in portions of the semiconductor substrate 100 on both sides of the buried gate 116. Preferably, the source and drain regions 120 are formed in such a way as to be connected with the channel of the buried gate 116 and have a depth that minimizes an overlap with the buried gate 116.

Thereafter, while not shown in a drawing, by sequentially conducting a series of well-known subsequent processes, the manufacture of a semiconductor device according to the second embodiment of the present invention is completed.

As is apparent from the above description, in the second embodiment of the present invention, due to the fact that a buried gate is formed to be filled in the lower portion of a groove defined in a semiconductor substrate, it is possible to protect against a gate electrode from being exposed out of the semiconductor substrate. Hence, in the present invention, it is possible to protect against the occurrence of a bridging phenomenon while subsequently conducting a contact plug forming process and a planarization process. Further, since contact between the buried gate and a bit line is protected against and thus parasitic capacitance can be decreased.

Also, in the second embodiment of the present invention, due to the fact that a barrier layer is formed along the sidewalls of the upper portion of the buried gate, unwanted leakage current between the buried gate and the source and drain regions can be minimized by the presence of the barrier layer, whereby GIDL can be reduced. Accordingly, in the present invention, as the data retention time is increased, the characteristics and the reliability of a semiconductor device can be improved.

In addition, in the second embodiment of the present invention, since the barrier layer is formed only on the sidewalls of the upper portion of the groove, the upper portion of the buried gate can be formed to have a projecting shape. By doing this, the sheet resistance of the buried gate of the in the present invention can be reduced and thereby the characteristics and the reliability of the resultant semiconductor device can be further improved.

While it was described in the above embodiments of the present invention that GIDL is reduced by forming the barrier layer comprising a nitride layer on the sidewalls of the upper portion of the buried gate, it is conceivable in another embodiment of the present invention that GIDL can be effectively reduced by forming an oxide layer instead of forming a nitride layer on the sidewalls of the upper portion of the buried gate.

FIGS. 3A through 3D are sectional views illustrating the processes of a method for manufacturing a semiconductor device in accordance with a third embodiment of the present invention.

Figure 3A:
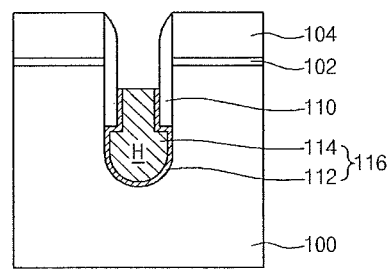
FIGS. 3A through 3D are sectional views illustrating the processes of a method for manufacturing a semiconductor device in accordance with a third embodiment of the present invention.

Referring to FIG. 3A, similarly to the above-described second embodiment of the present invention, after defining a groove H by etching a semiconductor substrate 100, a barrier layer 110 is formed on the sidewalls of the upper portion of the groove H. Then, a buried gate 116 is formed to fill the lower portion of the groove H. The buried gate 116 includes a gate insulation layer (not shown), a titanium nitride layer 112 and a tungsten layer 114 and the upper portion of the buried gate 116 is wider than the lower portion of the buried gate 116. Also shown are a pad oxide layer 102 and a pad nitride layer 104 on a semiconductor substrate 100.

Figure 3B:
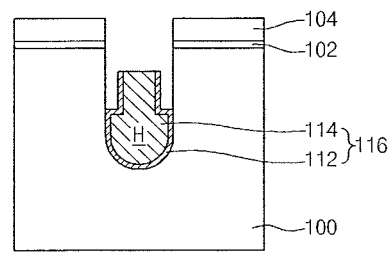

Referring now to FIG. 3B, the barrier layer 110 is removed from the resultant semiconductor substrate 100 which is formed with the buried gate 116. At this time, when removing the barrier layer 110, a partial thickness of the exposed pad nitride layer 114 may also be removed.

Figure 3C:
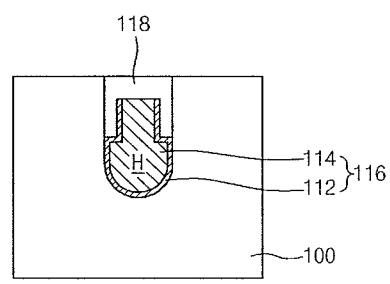

Referring now to FIG. 3C, a capping layer 118 is formed on the buried gate 116 so as to fill in the groove H removed with the barrier layer 110. The capping layer 118 is formed, for example, as an oxide layer. Next, the capping layer 118, the pad nitride layer 104 and the pad oxide layer 102 are removed so that the upper surface of the semiconductor substrate 100 is exposed.

Figure 3D:
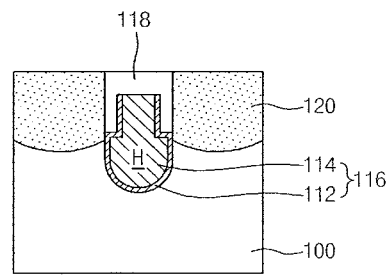

Referring now to FIG. 3D, by conducting an ion-implantation process for the exposed semiconductor substrate 100, source and drain regions 120 are formed in portions of the semiconductor substrate 100 on both sides of the buried gate 116. Preferably, the source and drain regions 120 are formed in such a way as to be connected with the channel of the buried gate 116 and have a depth that minimizes overlap with the buried gate 116.

Thereafter, while not shown in a drawing, by sequentially conducting a series of well-known subsequent processes, the manufacture of a semiconductor device according to the third embodiment of the present invention is completed.

As is apparent from the above description, in the third embodiment of the present invention, due to the fact that a barrier layer comprising a nitride layer is removed and a capping layer is filled between the sidewalls of the upper portion of a groove and the sidewalls of the upper portion of a buried gate, the leakage current between the buried gate and source and drain regions can be minimized by the presence of the capping layer, whereby GIDL can be reduced.

In particular, in the third embodiment of the present invention, since the capping layer comprises an oxide layer having a dielectric constant less than a nitride layer is formed on the sidewalls of the upper portion of the buried gate, it is possible to further minimize leakage current with a decreased thickness. As a consequence, in the present invention, the sheet resistance of the buried gate can be effectively reduced.

While it was described in the above embodiments of the present invention that the specific resistance of the buried gate is reduced by projecting the upper portion of the buried gate through allowing the upper portion of the buried gate to have a width smaller on than the lower portion thereof. It is conceivable in another embodiment of the present invention that the specific resistance of the buried gate can be further effectively reduced by forming the buried gate to have the same width on the upper and lower portions thereof.

Figure 4:
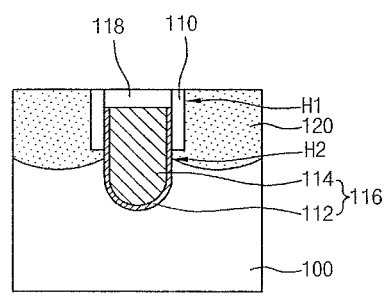
FIG. 4 is a sectional view illustrating a semiconductor device in accordance with a fourth embodiment of the present invention.

FIG. 4 is a sectional view illustrating a semiconductor device in accordance with a fourth embodiment of the present invention. A first groove H1 and a second groove H2 which communicates with the lower end of the first groove H1 are defined in a semiconductor substrate 100. The second groove H2 is placed at the center portion of the lower end of the first groove H1 and has a width narrower than the first groove H1. A buried gate 116, which has the same width on the upper and lower portions thereof, is formed in the second groove H2 and the lower portion of the first groove H1. The buried gate 116 comprises a metal-based layer, and for example, includes a titanium nitride layer 112 which is formed on the surface of the second groove H2 and the surface of a barrier layer 110 and a tungsten layer 114 which is formed on the titanium nitride layer 112 to fill the second groove H2 and the lower portion of the first groove H1. The barrier layer 110 is formed on the sidewalls of the upper portion of the buried gate 116 and the sidewalls of the first groove H1. The barrier layer 110 comprises, for example, a nitride layer, and preferably, has a thickness of about 50~500 Å. A capping layer 118 comprising an oxide layer is formed on the buried gate 116 to completely fill the first groove H1, and source and drain regions 120 are formed in portions of the semiconductor substrate 100 on both sides of the buried gate 116.

In the fourth embodiment of the present invention, due to the fact that the buried gate 116 is formed to be filled in the lower portion of the first groove H1 and the second groove H2 in the semiconductor substrate 100 such that a gate electrode does not project out of the semiconductor substrate 100, it is possible to protect against the occurrence of a bridging phenomenon while conducting a contact plug forming process and a planarization process. As a consequence, in the present invention, since contact between the buried gate 116 and a bit line is protected against, then parasitic capacitances can be decreased.

Also, in the present invention, because leakage current between the buried gate 116 and the source and drain regions 120 can be minimized by the presence of the barrier layer 110 which is formed on the sidewalls of the upper portion of the buried gate 116 and the sidewalls of the first groove H1, GIDL (gate-induced drain leakage) can be reduced. Accordingly, as the data retention time is increased, the characteristics and the reliability of a semiconductor device in the present invention can be improved.

In addition, in the fourth embodiment of the present invention, since the barrier layer 110 is formed only on the sidewalls of the first groove H1 that has a width larger than the second groove H2, the buried gate 116 can have the same width on the upper and lower portions thereof. Through this, in the present invention, the sheet resistance of the buried gate 116 is further reduced, whereby the characteristics and the reliability of the semiconductor device can be further improved.

FIGS. 5A through 5G are sectional views illustrating the processes of a method for manufacturing a semiconductor device in accordance with a fifth embodiment of the present invention.

Figure 5A:
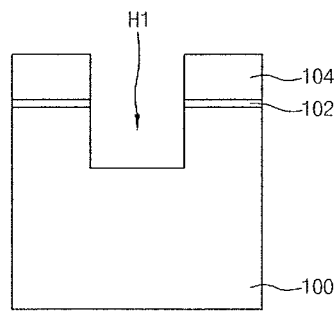
FIGS. 5A through 5G are sectional views illustrating the processes of a method for manufacturing a semiconductor device in accordance with a fifth embodiment of the present invention.

Referring now to FIG. 5A, after sequentially forming a pad oxide layer 102 and a pad nitride layer 104 on a semiconductor substrate 100, by patterning the pad nitride layer 104 and the pad oxide layer 102, a gate forming region of the semiconductor substrate 100 is exposed. Then, by primarily etching the exposed region of the semiconductor substrate 100, a first groove H1 is defined. The first groove H1 is defined to have a width larger, by the thickness of a material layer for a barrier to be subsequently formed, than a desired width of a gate.

Figure 5B:
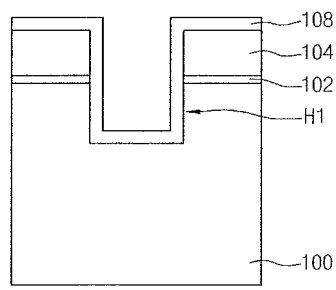

Referring now to FIG. 5B, a material layer 108 for a barrier is formed on the surfaces of the first groove H1 and the pad nitride layer 104. The material layer 108 for a barrier is formed, for example, as a nitride layer, preferably, to a thickness of about 50~500 Å.

Figure 5C:
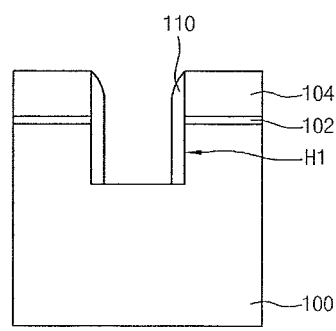

Referring now to FIG. 5C, the material layer 108 for a barrier is etched such that the material layer 108 for a barrier remains only on the sidewalls of the first groove H1. The etching of the material layer 108 for a barrier is conducted through an etch-back process, as a result of which a barrier layer 110 is formed on the sidewalls of the first groove H1.

Figure 5D:
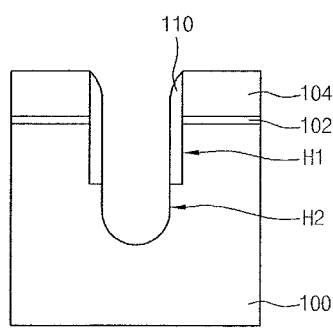

Referring now to FIG. 5D, by secondarily etching a portion of the semiconductor substrate 100 on the bottom of the first groove H1 by using the barrier layer 110 and the pad nitride layer 104 as an etch mask, a second groove H2 is defined. The secondary etching is conducted at the center portion of the bottom of the first groove H1. The second groove H2 is defined to have a width smaller, by the thickness of the barrier layer 110, than the first groove H1.

Figure 5E:
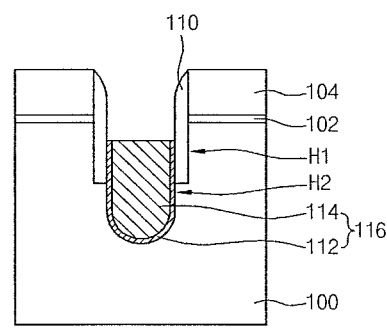

Referring to FIG. 5E, a gate insulation layer (not shown) is formed on the surfaces of the second groove H2 and the barrier layer 110, and a titanium nitride layer 112 is formed on the gate insulation layer. Thereupon, a tungsten layer 114 is formed on the titanium nitride layer 112 to fill the first and second grooves H1 and H2. Then, the tungsten layer 114, the titanium nitride layer 112 and the gate insulation layer are etched back so that the tungsten layer 114, the titanium nitride layer 112 and the gate insulation layer remain only in the second groove H2 and the lower portion of the first groove H1.

As a result, a buried gate 116 is formed so that the buried gate 116 is filled in the second groove H2 and the lower portion of the first groove H1 and contacts the barrier layer 110 at the upper portion thereof. The buried gate 116 is formed to have substantially the same width on the upper and lower portions thereof.

Figure 5F:
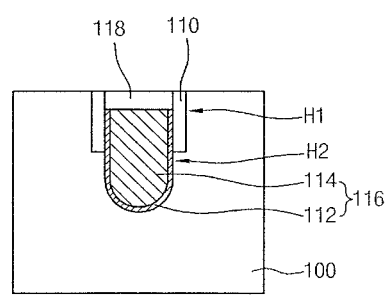

Referring now to FIG. 5F, a capping layer 118 is formed on the buried gate 116 to completely fill the first groove H1. The capping layer 118 is formed, for example, as an oxide layer. Next, the capping layer 118, the barrier layer 110, the pad nitride layer 104 and the pad oxide layer 102 are removed in a manner to expose the upper surface of the semiconductor substrate 100.

Figure 5G:
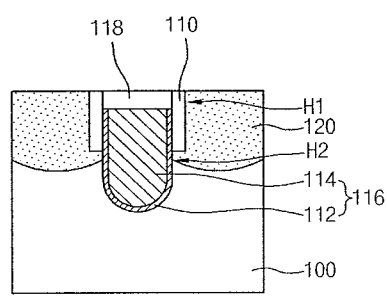

Referring now to FIG. 5G, by conducting an ion-implantation process for the exposed semiconductor substrate 100, source and drain regions 120 are formed in portions of the semiconductor substrate 100 on both sides of the buried gate 116. Preferably, the source and drain regions 120 are formed in such a way as to be connected with the channel of the buried gate 116 and have a depth that minimizes overlap with the buried gate 116.

Thereafter, while not shown in a drawing, by sequentially conducting a series of well-known subsequent processes, the manufacture of a semiconductor device according to the fifth embodiment of the present invention is completed.

As is apparent from the above description, in the fifth embodiment of the present invention, due to the fact that a buried gate is formed to be filled in a second groove and the lower portion of a first groove in a semiconductor substrate, it is possible to protect against a gate electrode from being exposed out of the semiconductor substrate. Hence, in the present invention, it is possible to protect against the occurrence of a bridging phenomenon while subsequently conducting a contact plug forming process and a planarization process. Further, since contact between the buried gate and a bit line is protected against, then parasitic capacitances can be decreased.

Also, in the fifth embodiment of the present invention, due to the fact that a barrier layer is formed on the sidewalls of the upper portion of the buried gate, leakage current between the buried gate and source and drain regions can be minimized by the presence of the barrier layer, whereby GIDL can be reduced. Accordingly, in the present invention, as the data retention time is increased, the characteristics and the reliability of a semiconductor device can be improved.

In addition, in the fifth embodiment of the present invention, since the barrier layer is formed only on the sidewalls of the first groove, the buried gate can be formed to have the same width on the upper and lower portions thereof. By doing this, when compared to the first through third embodiments of the present invention in which the buried gate is formed to project on the upper portion thereof having a width narrower than the lower portion thereof, the area of the buried gate is increased, whereby the sheet resistance of the buried gate can be effectively reduced.

In other words, in the fifth embodiment of the present invention, the lower portion of the buried gate which is placed in the second groove having a width narrower than the first groove and the upper portion of the buried gate which is placed in the lower portion of the first groove formed with the barrier layer can be formed to have substantially the same width. Therefore, in the present invention, as the sheet resistance of the buried gate can be effectively reduced, the characteristics and the reliability of a semiconductor device can be effectively improved.

While it was described in the above embodiments of the present invention that GIDL is reduced by forming the barrier layer comprising a nitride layer on the sidewalls of the upper portion of the buried gate, it is conceivable in another embodiment of the present invention that GIDL can be effectively reduced by forming an oxide layer in place of a nitride layer on the sidewalls of the upper portion of the buried gate.

FIGS. 6A through 6D are sectional views illustrating the processes of a method for manufacturing a semiconductor device in accordance with a sixth embodiment of the present invention.

Figure 6A:
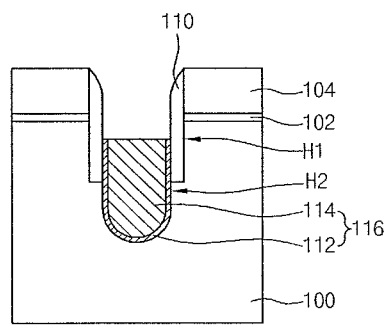
FIGS. 6A through 6D are sectional views illustrating the processes of a method for manufacturing a semiconductor device in accordance with a sixth embodiment of the present invention.

Referring now to FIG. 6A, similar to the above-described fifth embodiment of the present invention, after defining a first groove H1 by primarily etching a semiconductor substrate 100, a barrier layer 110 is formed on the sidewalls of the first groove H1. Then, a second groove H2 is defined by secondarily etching a portion of the semiconductor substrate 100 on the bottom of the first groove H1, and a buried gate 116 is formed to fill the second groove H2 and the lower portion of the first groove H1. The buried gate 116 includes a gate insulation layer (not shown), a titanium nitride layer 112 and a tungsten layer 114.

Figure 6B:
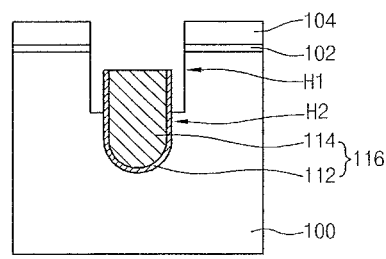

Referring to FIG. 6B, the barrier layer 110 is removed from the resultant semiconductor substrate 100 which is formed with the buried gate 116. At this time, when removing the barrier layer 110, a portion of the exposed pad nitride layer 114 may also be removed.

Figure 6C:
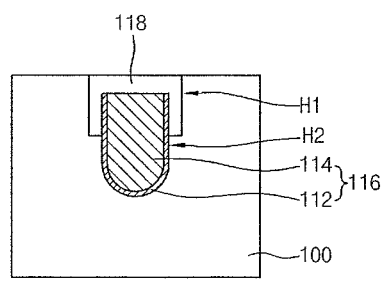

Referring to FIG. 6C, a capping layer 118 is formed on the buried gate 116 so as to fill in the first groove H1 removed with the barrier layer 110. The capping layer 118 is formed, for example, as an oxide layer. Next, the capping layer 118, the pad nitride layer 104 and the pad oxide layer 102 are removed in a manner such that the upper surface of the semiconductor substrate 100 is exposed.

Figure 6D:
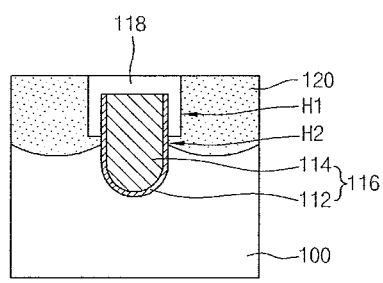

Referring to FIG. 6D, by conducting an ion-implantation process for the exposed semiconductor substrate 100, source and drain regions 120 are formed in portions of the semiconductor substrate 100 on both sides of the buried gate 116. Preferably, the source and drain regions 120 are formed in such a way as to be connected with the channel of the buried gate 116 and have a depth that minimizes overlap with the buried gate 116.

Thereafter, while not shown in a drawing, by sequentially conducting a series of well-known subsequent processes, the manufacture of a semiconductor device according to the sixth embodiment of the present invention is completed.

As is apparent from the above description, in the sixth embodiment of the present invention, due to the fact that a barrier layer comprising a nitride layer is removed and a capping layer is filled between the sidewalls of the upper portion of a groove and the sidewalls of the upper portion of a buried gate, leakage current between the buried gate and source and drain regions can be minimized by the presence of the capping layer, whereby GIDL can be reduced.

In particular, in the sixth embodiment of the present invention, since the capping layer comprising an oxide layer having a dielectric constant less than a nitride layer is formed on the sidewalls of the upper portion of the buried gate, it is possible to minimize leakage current with a decreased thickness. As a consequence, in the present invention, the sheet resistance of the buried gate can be effectively reduced.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A method for manufacturing a semiconductor device, the method comprising:
   defining a groove by etching a semiconductor substrate;
   forming a barrier layer over sidewalls of an upper portion of the groove; and
   forming a buried gate in a lower portion of the groove such that an upper portion of the buried gate contacts the barrier layer and such that a lower portion of the buried gate has a wider width than an upper portion of the buried gate.

2. The method according to claim 1, wherein the barrier layer comprises a nitride layer.

3. The method according to claim 1, wherein forming the barrier layer comprises:
   forming a sacrificial layer in a lower portion of the groove;
   forming a material layer for a barrier over the sacrificial layer and over a surface of the groove;
   etching the material layer for a barrier such that the material layer for a barrier remains substantially only over sidewalls of an upper portion of the groove; and
   removing the sacrificial layer.

4. The method according to claim 1, the method further comprises:
   forming a capping layer over the buried gate to fill the groove; and
   forming source and drain regions in portions of the semiconductor substrate along both opposing sides of the buried gate, wherein forming the capping layer and forming the source and drain regions performed after forming the buried gate.

5. The method according to claim 1, the method further comprises:
   removing the barrier layer;
   forming a capping layer over the buried gate to fill the groove removed with the barrier layer; and
   forming source and drain regions in portions of the semiconductor substrate along both opposing sides of the buried gate, wherein removing the barrier layer, forming the capping layer, and forming the source and drain regions performed after forming the buried gate.

6. The method according to claim 4, wherein the capping layer comprises an oxide layer.

7. The method according to claim 5, wherein the capping layer comprises an oxide layer.

8. A method for manufacturing a semiconductor device, comprising:
   defining a first groove by primarily etching a semiconductor substrate;
   forming a barrier layer over sidewalls of the first groove;
   defining a second groove by etching a portion of the semiconductor substrate on a bottom of the first groove such that the second groove has a width narrower than the first groove; and
   forming a buried gate in the second groove and in a lower portion of the first groove such that the buried gate contacts an upper portion of the barrier layer wherein upper and lower portions of the buried gate have substantially the same width.

9. The method according to claim 8, wherein the barrier layer comprises a nitride layer.

10. The method according to claim 8, the method further comprises:
    forming a capping layer over the buried gate to fill the first groove; and
    forming source and drain regions in portions of the semiconductor substrate along both sides of the buried gate wherein forming the capping layer and forming the source drain regions performed after forming the buried gate.

11. The method according to claim 8, the method further comprises:
    removing the barrier layer;
    forming a capping layer over the buried gate to fill the first groove removed with the barrier layer; and
    forming source and drain regions in portions of the semiconductor substrate along both sides of the buried gate, wherein removing the barrier layer, forming the capping layer, and forming the source and drain regions performed after forming the buried gate.

12. The method according to claim 10, wherein the capping layer comprises an oxide layer.

13. The method according to claim 11, wherein the capping layer comprises an oxide layer.

* * * * *